(12) United States Patent
Kabuki et al.

(10) Patent No.: US 7,901,108 B2
(45) Date of Patent: Mar. 8, 2011

(54) LED LIGHT SOURCE DEVICE

(75) Inventors: Kiyoyuki Kabuki, Himeji (JP);
Hiroshige Hata, Himeji (JP)

(73) Assignee: Ushiodenki Kabushiki Kaisha, Tokyo (JP)

( * ) Notice: Subject to any disclaimer, the term of this patent is extended or adjusted under 35 U.S.C. 154(b) by 210 days.

(21) Appl. No.: 12/417,177

(22) Filed: Apr. 2, 2009

(65) Prior Publication Data

US 2009/0251897 A1 Oct. 8, 2009

(30) Foreign Application Priority Data

Apr. 8, 2008 (JP) ................................ 2008-100039

(51) Int. Cl.
*F21V 1/00* (2006.01)
(52) U.S. Cl. ......... 362/235; 362/800; 362/334; 362/335; 362/340; 362/338
(58) Field of Classification Search .......... 362/326, 362/329, 334, 335, 308, 309, 310, 296.05, 362/311.01, 311.02, 311.06, 333, 340.338
See application file for complete search history.

(56) References Cited

U.S. PATENT DOCUMENTS

| | | | |
|---|---|---|---|
| 4,698,730 A | 10/1987 | Sakai et al. | |
| 5,173,810 A | 12/1992 | Yamakawa | |
| 5,230,560 A * | 7/1993 | Lyons | 362/297 |
| 6,607,286 B2 * | 8/2003 | West et al. | 362/255 |
| 6,755,556 B2 * | 6/2004 | Gasquet et al. | 362/329 |
| 7,111,964 B2 | 9/2006 | Suehiro et al. | |
| 7,461,960 B2 * | 12/2008 | Opolka et al. | 362/545 |
| 7,470,046 B2 * | 12/2008 | Kao et al. | 362/332 |
| 7,658,515 B2 * | 2/2010 | Park et al. | 362/311.02 |
| 7,744,246 B2 * | 6/2010 | Rizkin et al. | 362/245 |
| 2005/0168887 A1 * | 8/2005 | Yuasa et al. | 360/324.12 |
| 2005/0201118 A1 | 9/2005 | Godo | |

FOREIGN PATENT DOCUMENTS

| | | |
|---|---|---|
| JP | 61-198692 A | 9/1986 |
| JP | 63-33879 A | 2/1988 |
| JP | 8-107235 A | 4/1996 |
| JP | 11-146142 A | 5/1999 |
| JP | 2002-333656 A | 11/2002 |
| JP | 2005-209472 A | 8/2005 |

OTHER PUBLICATIONS

European Search Report for Application No. EP 09 00 4737 dated Aug. 6, 2009.

\* cited by examiner

*Primary Examiner* — Anabel M Ton
(74) *Attorney, Agent, or Firm* — Roberts Mlotkowski Safran & Cole, P.C.; David S. Safran

(57) ABSTRACT

An LED light source device using light from luminescent elements at a high level of uniformity and efficiency, and to conduct irradiation with a high level of design freedom an LED light source device is equipped with luminescent elements and a translucent light-guiding member. The translucent light-guiding member has a central convex lens with a first cylindrical light-guiding part formed on the outer periphery of the central convex lens and a second cylindrical light-guiding part formed on the outer periphery of the first cylindrical light-guiding part, such that an air layer is formed between the outer peripheral surface of the first cylindrical light-guiding part and the inner peripheral surface of the second cylindrical light-guiding part, the outer peripheral surface of the first cylindrical light-guiding part and the outer peripheral surface of the second cylindrical light-guiding part being rotated quadratic surfaces with the same focal point.

8 Claims, 7 Drawing Sheets

LED LIGHT SOURCE DEVICE

BACKGROUND OF THE INVENTION

1. Field of Invention

The present invention relates to an LED light source device, and more specifically, an LED light source device in which light from an LED (Light-Emitting Diode) is emitted in a specified direction and within a certain range via an optical member.

2. Description of Related Art

Conventionally, luminescent elements (LEDs) are used as a light source, an optical member is used such as a lens so that the light from this light source is radiated in a specific direction, and an LED light source device is widely used in order to control the light distribution from this optical member. (For an example, refer to published Japanese Patent Application No. H08 (1996)-107235.)

In order to effectively make use of light from luminescent elements (LEDs) used as a light source in an LED light source device of this constitution, a configuration is presented whereby a reflecting mirror is provided in order to cause the portion of light from the luminescent elements that does not reach the optical member to be guided toward it. (For an example, published Japanese Patent Application No. 2004-281605 (U.S. Pat. No. 7,111,964 B2).)

Specifically, FIG. 11 shows an LED light source device as disclosed in published Japanese Patent Application No. 2004-281605 (U.S. Pat. No. 7,111,964 B2). This device is provided with luminescent elements (LEDs) 21 as a light source along with a reflecting mirror 108 which has a reflecting surface 108A composed of an aluminum vapor deposition film. Further, the optical member 103 is composed of the following: a first optical part 104 in which a translucent resin is used as a substrate 101, onto which the luminescent elements (LED) 21 are provided, and the light from these elements is refracted and radiated in a direction perpendicular to the Z-axis direction; a second optical part 105 in which the light from the luminescent elements 21 is condensed and radiated in the Z-axis direction; and a third optical part 106 in which the light from the luminescent elements 21 is radiated in the Z-axis direction based on its total reflection.

With the optical member 103 of this LED light source device, based on the first optical part 104, the light in the 60-90° range direction from the aperture half-angle of the luminescent elements 21 (that is, the angle with respect to the center axis of the luminescent elements 21, or the Z-axis in FIG. 11) as a portion of the light from the luminescent elements 21 is refracted and radiated in a direction perpendicular to the Z-axis direction. Based on the second optical part 105, the light in the 35° or less range direction from the aperture half-angle of the luminescent elements 21 as a portion of the light from the luminescent elements 21 is radiated in the Z-axis direction. And based on the third optical part 106, the light in the 35-60° range direction from the aperture half-angle of the luminescent elements 21 undergoes total reflection and is radiated in the Z-axis direction.

In FIG. 11, element 101 is a substrate in which an insulation layer 101B is deposited onto the base material 101A, and a wiring pattern 101C is formed on this insulation layer 101B. Further, in this figure, element 107 is a wire, L5 is a pathway for the light that first enters the second optical part 105 and is then radiated from the hemispherical light radiation surface 105A, L6 is a pathway for the light that first enters the third optical part 106 and is then reflected by the reflection surface 106B and radiated from the disk-shaped light radiation surface 106A, and L7 is a pathway for the light that first enters and exits the first optical part 104 and is then reflected by the reflecting mirror 108.

Based on an LED light source device of this configuration, it is possible to control the majority of light from luminescent elements 21 using the optical member 103, which is to say that it becomes possible to reduce the amount of light that is guided to the optical member 103 through the action of the reflecting mirror 108. Accordingly, it becomes unnecessary to install a large reflecting mirror, and by installing this reflecting mirror 108 the need for a large-scale device can be prevented, thus making it possible to design a small-scale LED light source device.

However, with this type of LED light source device, light that is reflected by the reflecting mirror 108 and then radiated (specifically, light that is radiated by passing through the first optical part 104) passes through multiple boundary surfaces (specifically, for example, the boundary surface between the optical member 103 and the air layer that exists along the periphery of this optical member 103) in order to be radiated, and therefore, there is a large rate of occurrence of boundary reflection and reflection loss caused by refraction, etc., that occurs at these boundary surfaces. As a result, a high factor of light utilization cannot be achieved. Moreover, for the sake of achieving a favorable form of radiated light, it is necessary to create designs that take into consideration these instances of refraction at the boundary surfaces, and the problem is that such designs themselves are difficult to produce.

Furthermore, in this LED light source device, a reflecting mirror 108 is provided for the purpose of making use of high-angle light (for example, light with a range direction in which the aperture half-angle of the luminescent elements 21 exceeds 60°), but in the case of this high-angle light, the level of light is lower compared to that of low-angle light. For this reason, on a surface that has been irradiated by the light from this LED light source device, the illuminance in the peripheral area in which light that is reflected by the reflecting mirror 108 is irradiated is considerably lower when compared to the illuminance in the center area. Because of this, a problem exists in which it is difficult for irradiation to be conducted in a uniform manner on this irradiated surface at a high illuminance. Therefore, this type of LED light source device is not suitable for light irradiation of surfaces that have a considerable amount of surface area. That is to say, in order to provide light irradiation on a surface that has a broad surface area, several LED packages composed of luminescent elements and optical members must be provided, and even in cases where the configuration is such that these multiple LED packages are arranged on a common substrate, it is impossible to conduct even irradiation of light onto the surface, and moreover, it is impossible to obtain a sufficient illuminance in order to do so.

SUMMARY OF THE INVENTION

Based on the conditions noted above, it is an object of the present invention to provide an LED light source device in which it is possible not only to make use of light from luminescent elements at a high level of efficiency, but also to conduct irradiation with a high level of design freedom and in such a way that the light is irradiated uniformly at a high illuminance onto a given surface.

An LED light source device is equipped with luminescent elements and a translucent light-guiding member, this translucent light-guiding member having a central convex lens with a first cylindrical light-guiding part formed on the outer periphery of the central convex lens and a second cylindrical light-guiding part formed on the outer periphery of the first cylindrical light-guiding part, such that an air layer is formed between the outer peripheral surface of the first cylindrical light-guiding part and the inner peripheral surface of the second cylindrical light-guiding part, the outer peripheral surface of the first cylindrical light-guiding part and the outer peripheral surface of the second cylindrical light-guiding part are rotated quadratic surfaces, each with the same focal point, and the light emitted from the luminescent element of each of these rotated quadratic surfaces travels along the optical axis of the translucent light-guiding member and is reflected in the light radiation direction.

In the LED light source device of the present invention, it is preferred that the inner peripheral surface of the second cylindrical light-guiding part belonging to the translucent light-guiding member have a tapered shape that widens toward the outside such that a portion of the light that is reflected at the outer peripheral surface of the second cylindrical light-guiding part is obstructed.

In the LED light source device of the present invention, it is preferred that the translucent light-guiding member be made from a material in which the refractive index is at least 1.4.

In the LED light source device of the present invention, multiple luminescent elements may be provided on a common substrate, and a translucent light-guiding member may be provided that corresponds to each of these multiple luminescent elements.

In the LED light source device of the present invention, the translucent light-guiding member has, along with a central convex lens, multiple cylindrical light-guiding parts, specifically, a first cylindrical light-guiding part and second cylindrical light-guiding part. Further, this device has a configuration in which light from luminescent elements, based on rotated quadratic surfaces that have the same focal point and comprise the outer peripheral surface of the first cylindrical light-guiding part as well as the outer peripheral surface of the second cylindrical light-guiding, travels along the optical axis of the translucent light-guiding member and is reflected in the light radiation direction. Accordingly, in the case of each of the components that make up this translucent light-guiding member, namely the central convex lens part, the first cylindrical light-guiding part and the second cylindrical light-guiding part, the incidence light from the luminescent elements, rather than being emitted toward another component, is guided within each part along the optical axis in the light radiation direction, making it possible to cause light radiation from this translucent light-guiding member. Thus, it becomes easy to control the distribution of light from luminescent elements by means of the translucent light-guiding member, making it possible to prevent the occurrence of boundary reflection. Moreover, it becomes possible to guide and radiate light from luminescent elements by means of the translucent light-guiding member without the use of another member, such as a reflecting mirror, and since it is acceptable to form a light-guiding path within each of the components of the translucent light-guiding member itself, it is unnecessary to form light-guiding paths for light to travel through the boundary surfaces of multiple components, thus achieving a high level of design freedom.

Further, since it becomes possible in the case of the translucent light-guiding member, through the existence of an air layer along its periphery, for total reflection of light to occur by means of the outer peripheral surface of the first cylindrical light-guiding part as well as both the inner and outer peripheral surfaces of the second cylindrical light-guiding part, it is therefore possible to control the occurrence of reflection loss.

Accordingly, based on the LED light source device of the present invention, it becomes possible not only to utilize light from luminescent elements in a highly efficient manner, but also to achieve a high level of design freedom and provide uniform irradiation of light onto a surface at high illuminance.

The following is a detailed description of embodiments of the present invention, with reference to the accompanying drawings.

DETAILED DESCRIPTION OF THE INVENTION

The LED light source device of the invention is equipped with luminescent elements (LED: Light-Emitting Diode) 21 that are used as a light source, and the LED package 20 that is made up of these elements 21 along with a translucent light-guiding member 30 that is used as an optical member are installed onto a substrate 11.

The luminescent elements 21 that make up the LED package 20 are arranged such that an insulation layer 11B is laminated onto the base material 11A, followed by a wire pattern (not shown) that is formed on this insulation layer 11B to form the substrate 11, onto which the luminescent elements 21 are placed in their positions that are exposed on the base material 11A, after which they are electrically connected to the wiring pattern that is formed on the insulation layer 11B.

Figure 1:
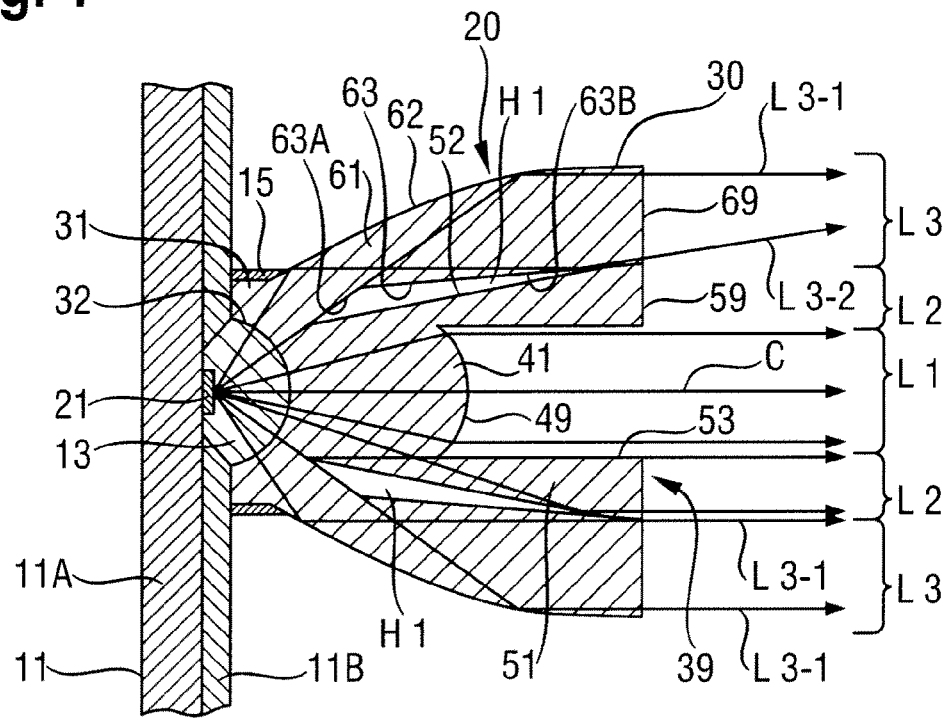
FIG. 1 is an explanatory cross-sectional view showing an example of the configuration of the LED light source device of the present invention.
Figure 2:
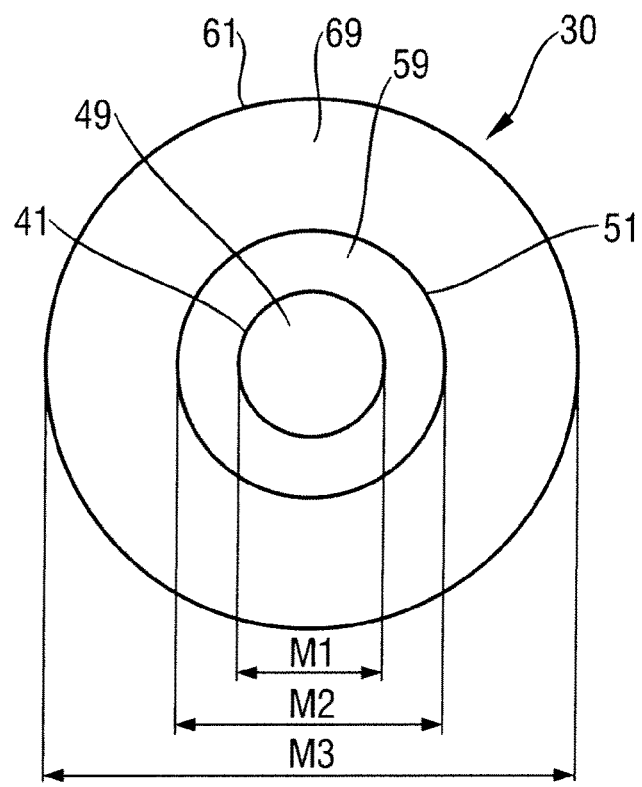
FIG. 2 is an explanatory drawing showing the light radiation surface of the LED light source device noted in FIG. 1.

In the example shown in FIG. 1, the luminescent elements 21 are molded using a hemispherical molding member 13 in which a heat-resistant translucent resin such as a silicon resin is used.

For the luminescent elements 21 it is possible to use those that radiate ultraviolet radiation or visible light. For example, it is suitable to use a type of LED that distributes light in accordance with COS rules (hereinafter referred to as a "COS light-distribution LED").

As for the translucent light-guiding member 30 that makes up the LED package 20, the overall shape is that of a bowl with a column-shaped part and a bowl-shaped part that connects to this column-shaped part. The column-shaped part is composed of a cylindrical base end part 31 having a column-shaped central convex lens part 41, a first cylindrical light-guiding part 51, which is formed along the outer periphery of this central convex lens part 41, and a second cylindrical light-guiding part 61, which is formed along the outer periphery of this first cylindrical light-guiding part 51. In this translucent light-guiding member 30, a light radiation surface is formed on each component of the bowl-shaped part, specifically, a hemispherical light radiation surface 49 for the central convex lens part 41, a disk-shaped light radiation surface 59 for the first cylindrical light-guiding part 51, and a disk-shaped light radiation surface 69 for the second cylindrical light-guiding part 61, and these three together form the light radiation surface 39.

Further, in the translucent light-guiding member 30, a hemispherical storage space 32 for the luminescent element is positioned so as to face the light radiation surface 39 using a cylindrical base end part 31.

In the example shown in this figure, between the molding member 13 that molds the luminescent element 21 and the translucent light-guiding member 30, the outer peripheral surface of the molding member 13 is optically joined with the inner peripheral surface of the translucent light-guiding member 30 that acts as a partition for the luminescent element storage space 32. Thus, on the boundary surface between the molding member 13 and the translucent light-guiding member 30, occurrences of light refraction and reflection are controlled, and therefore, the light from the luminescent element 21 is emitted such that it can enter the translucent light-guiding member 30 via the molding member 13 in a highly efficient manner.

In the translucent light-guiding member 30, between the outer peripheral surface 52 of the first cylindrical light-guiding part 51 and the inner peripheral surface 63 of the second cylindrical light-guiding part 61, a cylindrical space is formed that surrounds the first cylindrical light-guiding part 51, and this space provides an air layer H1 that surrounds the first cylindrical light-guiding part 51 and the second cylindrical light-guiding part 61.

The configuration of the outer peripheral surface 52 of the first cylindrical light-guiding part 51 that partitions this air layer H1 is that of a rotated quadratic surface along with the outer peripheral surface 62 of the second cylindrical light-guiding part 61 in which an air layer exists at the outer periphery, and therefore, the rotated quadratic surface formed by the outer peripheral surface 52 of the first cylindrical light-guiding part 51 and the rotated quadratic surface formed by the outer peripheral surface 62 of the second cylindrical light-guiding part 61 both have the same focal point.

In the case of the outer peripheral surface 52 of the first cylindrical light-guiding part 51 as well as the outer peripheral surface 62 of the second cylindrical light-guiding part 61, since each has an air layer along the outer periphery, the light that enters the first cylindrical light-guiding part 51 by means of its outer peripheral surface 52 undergoes total reflection, as does the light that enters the second cylindrical light-guiding part 61 by means of its outer peripheral surface 62. Each of these lights is reflected in a direction specified according to the configuration of its respective rotated quadratic surface (outer periphery surfaces 52 and 62), after which these lights follow along the light axis C and are guided toward their respective light radiation surfaces 59 and 69 that are positioned in the light radiation direction (toward the right in FIG. 1).

In the example shown in this figure, the rotated quadratic surface composed of the outer peripheral surface 52 of the first cylindrical light-guiding part 51 as well as that composed of the outer peripheral surface 62 of the second cylindrical light-guiding part 61 are both paraboloids, and moreover, both of the reflected lights along the outer peripheries 52 and 62 are light beams directed in parallel directions with respect to the light axis C of the translucent light-guiding member 30.

Further, the configuration of the inner peripheral surface 63 of the second cylindrical light-guiding part 61 that partitions the air layer H1 is such that light enters this second cylindrical light-guiding part 61, and the light that is reflected by the rotated quadratic surface (paraboloid) composed of the outer peripheral surface 62 can be guided toward the light radiation surface 69.

Specifically, in order to prevent blockage of the light path of the reflected light (hereinafter referred to as the "reflected light path") from the outer peripheral surface 62 of the second cylindrical light-guiding part 61 up to the point where it reaches the light radiation surface 69, the inner peripheral surface 63 of the second cylindrical light-guiding part 61 can be arranged parallel to this reflected light path, but it is preferred that the inner peripheral surface 63 be tapered so that it widens toward the outside in order to obstruct a portion of this reflected light path.

By providing a tapered shape for the inner peripheral surface 63 of the second cylindrical light-guiding part 61, so that it widens toward the outside and a portion of the reflected light from the outer peripheral surface 62 is obstructed, a reflecting surface is formed that reflects the light that travels in a direction other than one in which it is possible to reach the light radiation surface 69 directly within the second cylindrical light-guiding part 61 as a portion of the light that is reflected at the outer peripheral surface 62 by means of the inner peripheral surface 63, and since an air layer H1 exists along the outer periphery of this reflecting surface, the light that enters undergoes total reflection.

Figure 5:
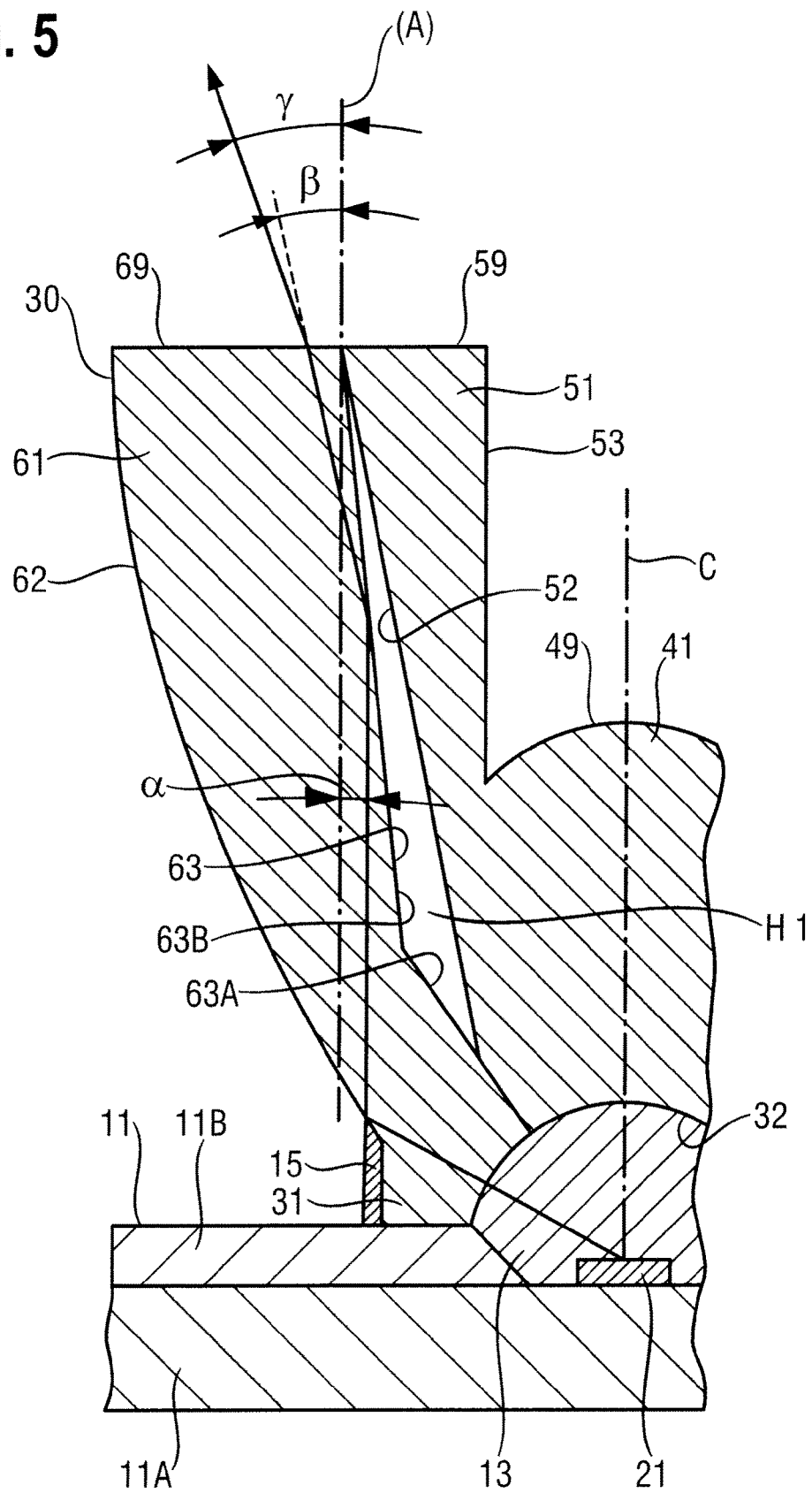
FIG. 5 is an explanatory expanded cross-sectional view showing a primary part of the LED light source device noted in FIG. 1.

As shown in detail in FIG. 5, the inner peripheral surface 63 of the second cylindrical light-guiding part 61 is made up of a first tapered surface 63A and a second tapered surface 63B that has a slightly smaller oblique angle than the first tapered surface 63A, and a reflecting surface is formed by means of the second tapered surface 63B.

With regard to the oblique angle α of the reflecting surface that is formed by means of the second tapered surface 63B at the inner peripheral surface 63 of the second cylindrical light-guiding part 61, specifically, the light that is reflected from the light radiation surface 69 of the second cylindrical light-guiding part 61 is first reflected toward this light radiation surface 69 at an angle β(=2α) that makes a virtual line (A) by means of the reflecting surface that is formed by the second tapered surface 63B, and it is preferred that the conditions shown in the formula below be met in order to provide an angle γ with a maximum angle of 20° that makes a virtual line (A) for the light that is reflected from the light radiation surface 69. In the formula, n represents the refractive index of the material used to make the translucent light-guiding member 30.

$$\alpha \leq \text{Arc Sin}(\text{Sin}(20°)/n)/2 \qquad \text{Formula (1)}$$

Here, the virtual line (A) is the portion of the line that is parallel to the reflected light path of the light that is reflected at the outer peripheral surface 62 of the second cylindrical light-guiding part 61, and in the example shown in this figure, this virtual line is parallel to the light axis C of the translucent light-guiding member 30.

Further, in the translucent light-guiding member 30, the inner peripheral surface 53 of the first cylindrical light-guiding part 51 has a configuration that prevents blockage of the pathway for the light that is reflected from the light radiation surface 59 of the first cylindrical light-guiding part 51 as well as the light radiation surface 49 of the central convex lens part 41.

In the example shown in this figure, the inner peripheral surface 53 of the first cylindrical light-guiding part 51 is arranged parallel to the light axis C, and a disk-shaped air space partition is provided in order to allow passage of the light that is radiated from the light radiation surface 49 of the central convex lens part 41 by means of this inner peripheral surface 53.

Given a translucent light-guiding member 30 of this configuration, it is possible, for example, to produce this member by combining and joining a first structure 70, which is used to form the cylindrical base end part 31 and second cylindrical light-guiding part 61, with a second structure 80, which is used to form the central convex lens part 41 and first cylindrical light-guiding part 51.

The first structure 70 that is used to form the translucent light-guiding member 30 has an overall configuration resembling the shape of a bowl and having a cylindrical base end part 31 and second cylindrical light-guiding part 61. On the inside, the second structure 80 is stored, and a luminescent element storage space 32 is also provided along with a column-shaped inner air space 71 for the purpose of forming an air layer H1.

This inner air space 71 of the first structure 70 is partitioned by the following: a curved formation surface 71A for the purpose of partitioning the luminescent element storage space 32, a tapered formation surface 71B for the purpose of forming a joining surface with the second structure 80 as well as a first tapered surface 63A on the inner peripheral surface 63 of the second cylindrical light-guiding part 61, and a second tapered surface 63B on the inner peripheral surface 63 of the second cylindrical light-guiding part 61 that connects to the tapered formation surface 71B.

Here, the tapered surface that makes up the tapered formation surface 71B has an oblique angle that is set so that the boundary surface between the first and second structures 70, 80 (specifically, the boundary surface that is formed by the joining of the tapered formation surface 71B of the first structure 70 and the joining surface 82, discussed below, of the second structure 80) is not positioned on any of the light-guiding paths up to the point where the light that has entered the second cylindrical light-guiding part 61 reaches the outer peripheral surface 62, that is to say, an intersection of the light-guiding path and boundary surface does not occur.

Figure 3:
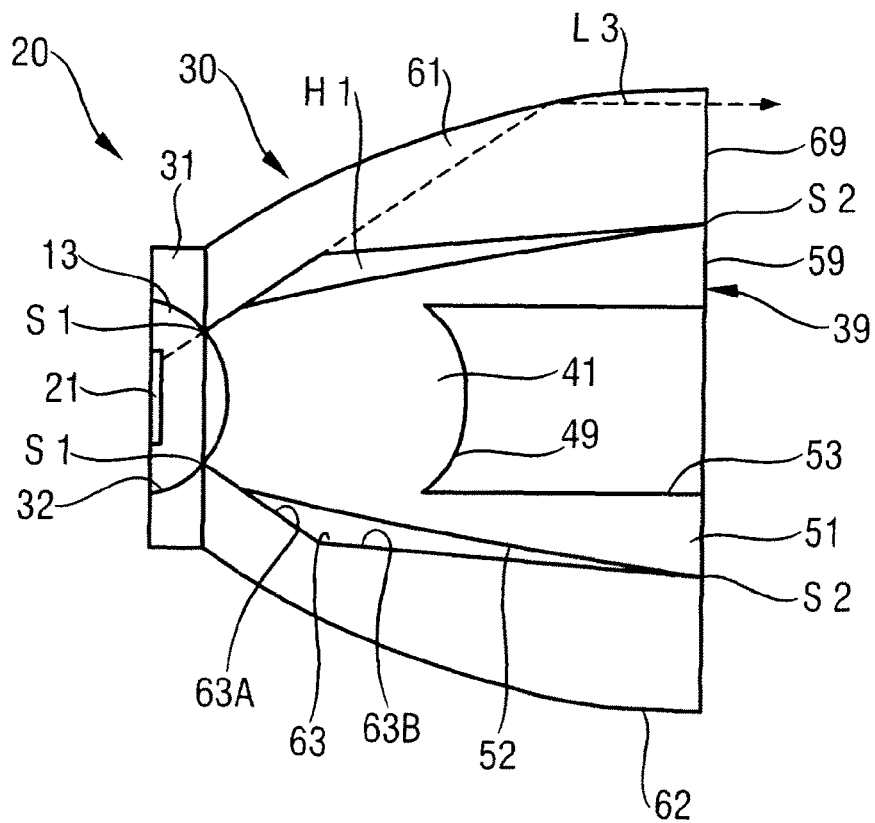
FIG. 3 is an explanatory drawing showing the LED package configuration that makes up the LED light source device noted in FIG. 1.
Figure 4:
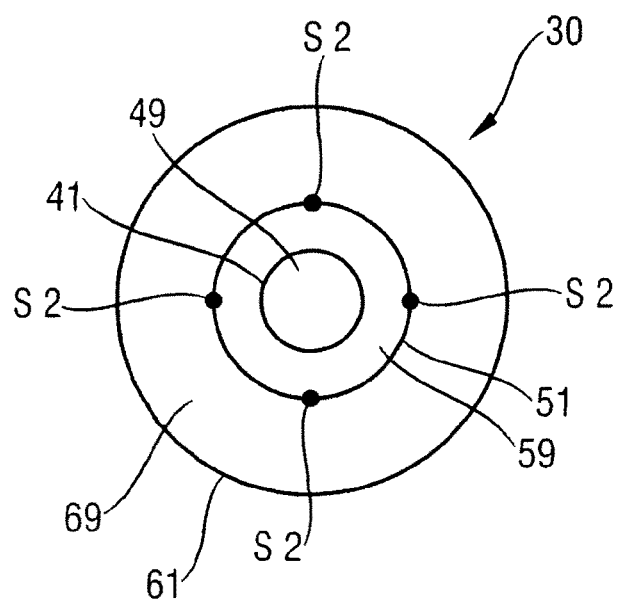
FIG. 4 is a front view of the LED package shown in FIG. 3.

Specifically, an oblique angle is set for the tapered formation surface 71B so that it will follow the light-guiding path that is formed in the centermost position along the light-guiding path for the light that reaches the outer peripheral surface of the second cylindrical light-guiding part 61 (this is the light-guiding path for the light in which the angle that makes the most virtual line (A) (see FIG. 5) becomes smaller, and is the light-guiding path related to the pathway for the light that is shown by L3 in FIG. 3).

Further, the second structure 80 has an outer appearance that is cylindrical with a slight bowl-shaped configuration, and it contains the central lens part 41 and first cylindrical light-guiding part 51.

On the bottom surface of this second structure 80, a partitioning surface 81 is formed for the purpose of partitioning the luminescent element storage space 32, and the outer peripheral surface is composed of a joining surface 82 made up of a tapered surface for the purpose of forming a surface to be joined with the first structure 70, along with an outer peripheral surface 52 of the first cylindrical light-guiding part 51 made up of a tapered surface having an oblique angle that is smaller than that of the joining surface 82.

Note that the tapered surface that makes up the joining surface 82 has an oblique angle that is the same as that of the tapered formation surface 71B of the first structure 70 to which it will be joined.

Figure 6:
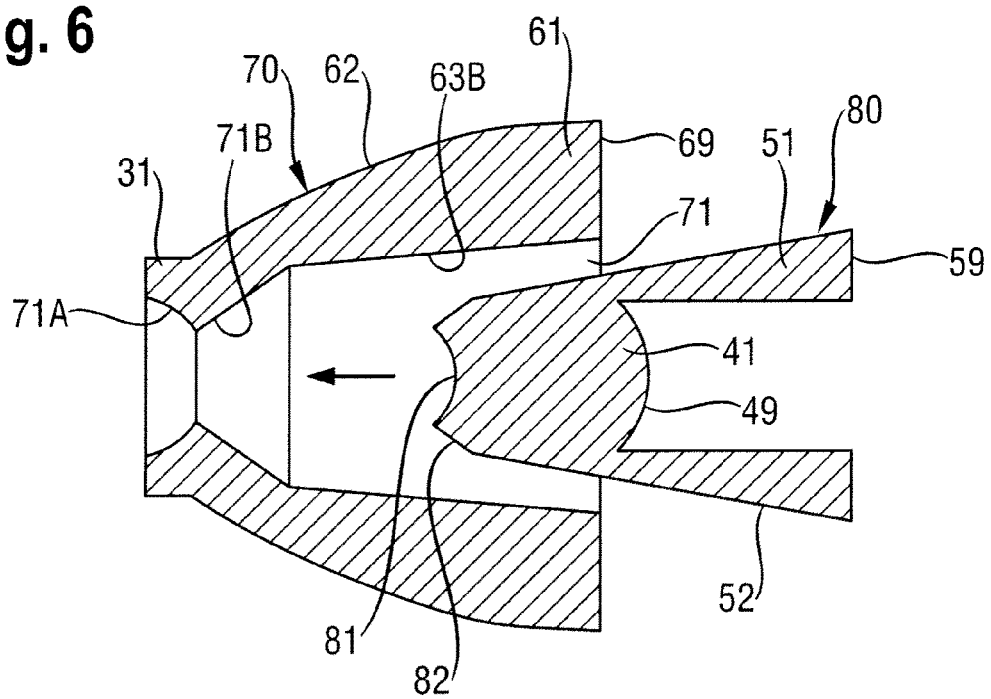
FIG. 6 is an explanatory exploded view showing the structure of the translucent light-guiding member that makes up the LED light source device shown in FIG. 1.

Specifically, the translucent light-guiding member 30 provides the first structure 70 and second structure 80 such that the second structure 80 is inserted into the inner air space 71 of the first structure 70 with the axes matching each other. Given this configuration, the joining surface 82 of the second structure 80 makes direct contact with a portion (see left side in FIG. 6) that is used in order to form a joining surface on the tapered formation surface 71B of the first structure 70, and through this point of contact, junction S1 is formed and secured, thus forming a contact between the side edge (see right edge portion in FIG. 6) of the light radiation surface 59 on the outer peripheral surface 52 of the second structure 80, and the side edge (see right edge portion in FIG. 6) of the light radiation surface 69 on the second tapered surface 63B of the first structure 70, resulting in the formation of the translucent light-guiding member 30.

It is preferred that a translucent light-guiding member 30 of this configuration be made from a material in which the refractive index is at least 1.4. Specific examples of such material include transparent acrylic (PMMA: polymethylmethacrylate) resin, polycarbonate resin, etc.

Further, it is preferred that a light absorption layer 15 be applied to the outer peripheral surface on the cylindrical base end part 31 of the translucent light-guiding member 30.

Examples of a substance to be used for this light absorption layer 15 include black film, black paint, etc.

A specific example of a constitution for the LED light source device may include the following: a COS light-distribution LED may be used as a luminescent element 21; a product made from a PMMA resin with a refractive index of 1.485 may be used as a translucent light-guiding member 30. As for dimensions, the luminescent elements 21 will have an outer diameter with a 1 mm angle, and the translucent light-guiding member 30 will have a light radiation surface 49 related to the central convex lens part 41 with an outer diameter M1 of 3.6 mm, a light radiation surface 59 related to the first cylindrical light-guiding part 51 with an outer diameter M2 of 6.2 mm and a light radiation surface 69 related to the second cylindrical light-guiding part 61 with an outer diameter M3 of 11 mm.

In the case of an LED light source device with the type of configuration noted above, the light from these luminescent elements 21 that are the light source enters the translucent light-guiding member 30 through the illumination of the luminescent elements 21 by way of the molded member 13 and is then guided by the translucent light-guiding member 30 and radiated from the light radiation surface 39.

Also, with this LED light source device, the translucent light-guiding member 30 has a central convex lens part 41 along with multiple cylindrical light-guiding parts, specifically, a first cylindrical light-guiding part 51 and a second cylindrical light-guiding part 61. Through the use of each of the paraboloids having the same focal point and consisting of the outer peripheral surface 52 of the first cylindrical light-guiding part 51 as well as the outer peripheral surface 62 of the second cylindrical light-guiding part 61, the light from the luminescent elements 21 travels along the light axis and is reflected in the light radiation direction. Thus, the light that has entered the translucent light-guiding member 30 by way of the molded member 13 and has been sent from the luminescent elements 21 is then guided to each component that makes up the light radiation surface 39 of the translucent light-guiding member 30, specifically, the central convex lens part 41 related to the light radiation surface 49, the first cylindrical light-guiding part 51 related to the light radiation surface 59, and the second cylindrical light-guiding part 61 related to the light radiation surface 69, after which the light is radiated from the light radiation surface 39.

Specifically, as part of the light from the luminescent elements 21, the light in the 20° or less range direction from the aperture half-angle of the luminescent elements 21 (that is, the angle with respect to the center axis of the luminescent elements 21), as illustrated by light path L1, first enters the central convex lens part 41 and is then guided directly toward the light radiation surface 49, after which it is radiated from this light radiation surface 49.

Further, as part of the light from the luminescent elements 21, the portion of light in the 70° or less range direction from the aperture half-angle of the luminescent elements 21, as illustrated by light path L2 in FIG. 1, first enters the first cylindrical light-guiding part 51 and is then guided toward the light radiation surface 59 by means of the reflection from the outer peripheral surface 52 that is composed of a paraboloid, after which it is radiated from this light radiation surface 59. As for the remaining portion of light, as illustrated by light path L3, this first enters the second cylindrical light-guiding part 61 and is reflected by the outer peripheral surface 62 that is composed of a paraboloid, and this portion of reflected light (for example, light path L3-1 in FIG. 1) is guided toward the light radiation surface 69 while the other portion (for example, light path L3-2 in FIG. 1) is guided toward the light radiation surface 69 by means of the reflection from the second tapered surface 63B on the inner peripheral surface 63, after which each portion is radiated from the light radiation surface 69.

Here, with this LED light source device, as part of the light from the luminescent elements 21, light in the 70° or less range direction from the aperture half-angle of the luminescent elements 21 is guided to the translucent light-guiding member 30 and radiated from the light radiation surface 39. However, by using COS light-distribution LEDs as a light source, in the case of luminescent elements 21 composed of COS light-distribution LEDs, the light that is radiated in the over 70° range direction from the aperture half-angle has a low rate (small light amount), and therefore it is possible to use light from these luminescent elements 21 at a high utilization rate of 80%.

As such, for each of the components that make up the translucent light-guiding member 30, namely the central lens part 41, the first cylindrical light-guiding part 51 and the second cylindrical light-guiding part 61, the light from the luminescent elements 21 is guided along the light axis C of the translucent light-guiding member 30 internally without being emitted toward any other part and continues in the light radiation direction, after which it is radiated from the light radiation surface. Therefore, it becomes easy to control the distribution of light from the luminescent elements 21 by means of this translucent light-guiding member 30, and it is also possible to prevent the occurrence of boundary reflection. Moreover, it becomes possible to guide and radiate light from the luminescent elements 21 by means of this translucent light-guiding member 30 without having to send the light through another member such as a reflecting mirror. Further, since it is acceptable to form a light-guiding path within each of the components of the translucent light-guiding member 30 itself, it is unnecessary to form light-guiding paths for light to travel through the boundary surfaces of multiple components, thus making it possible to achieve a high level of design freedom.

In addition, since it becomes possible in the case of the translucent light-guiding member 30, through the existence of an air layer along its outer periphery, for total reflection of light to occur by means of the outer peripheral surface 52 of the first cylindrical light-guiding part 51 as well as the second tapered surface 63B along the inner peripheral surface 63 of the second cylindrical light-guiding part 61 and the outer peripheral surface 62 of the second cylindrical light-guiding part 61, it is therefore possible to control the occurrence of reflection loss.

Further, as part of the light from the luminescent elements 21, due to the fact that the utilization of high-angle light, in which the level of light is lower in comparison to low-angle light, is controlled, it is possible for light that is radiated from the light radiation surface 39 to achieve uniform irradiation as well as high illuminance on a given surface.

Therefore, through the use of this LED light source device, it is possible not only to make use of light from luminescent elements at a high level of efficiency, but also to achieve a high level of design freedom. Further, since a high level of uniformity is achievable in the case of light that is radiated from the LED package 20, it becomes possible for a given surface to undergo high illuminance in a uniform fashion.

Further, this LED light source device is equipped with a light absorption layer 15 on the outer peripheral surface of the cylindrical base end part 31, and as part of the light from the luminescent elements 21, light that is not radiated from the light radiation surface 39 after it enters the translucent light-guiding member 30, specifically light that is radiated in the over 70° range direction from the aperture half-angle of the luminescent elements 21 can be absorbed by this light absorption layer 15, and as a result, it becomes possible to prevent the occurrence of stray light caused by the radiation of light from the cylindrical base end part 31.

In addition, with this LED light source device, although the translucent light-guiding member 30 is made by combining the first and second structures 70, 80, the first structure 70 has the cylindrical base end part 31 and second cylindrical light-guiding part 61 while the second structure 80 has the central lens part 41 and first cylindrical light-guiding part 51, and the boundary surface that is formed when the two structures are combined is designed to run along the light guiding path that is formed within the translucent light-guiding member 30 in such a way as to not intersect with this light-guiding path. As a result, there is no need for a light junction to occur along the entire region of the boundary surface between these first and second structures 70, 80, and since it is possible to have point contacts at junctions S1, S2, the manufacture of this device is made very easy. Further, since it is acceptable to form the boundary surface between the first and second structures 70, 80 along the light-guiding path, the designs of these structures are also made easy.

Given the LED light source device of the present invention with the type of structure noted above, it is possible to suitably use this device specifically as a light source device for resist irradiation in order to conduct light irradiation over a surface with a considerably broad surface area.

Figure 7:
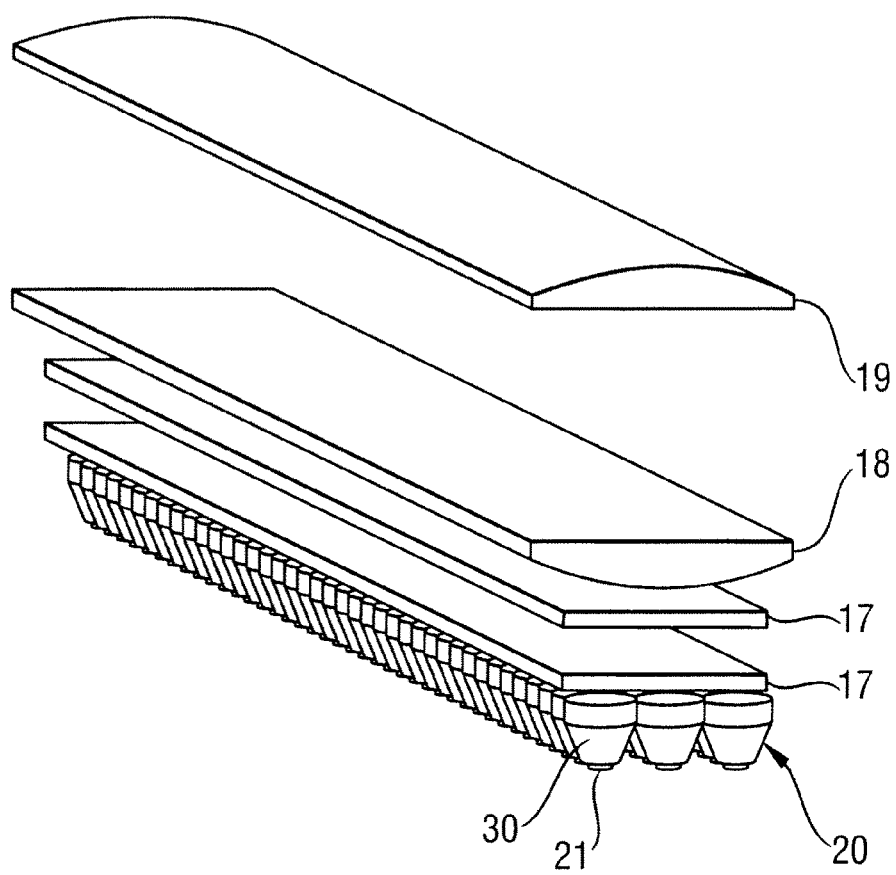
FIG. 7 is an explanatory perspective view of an example of the configuration of the LED light source device of the present invention in the case where it is used as a light source device for resist irradiation.
Figure 8:
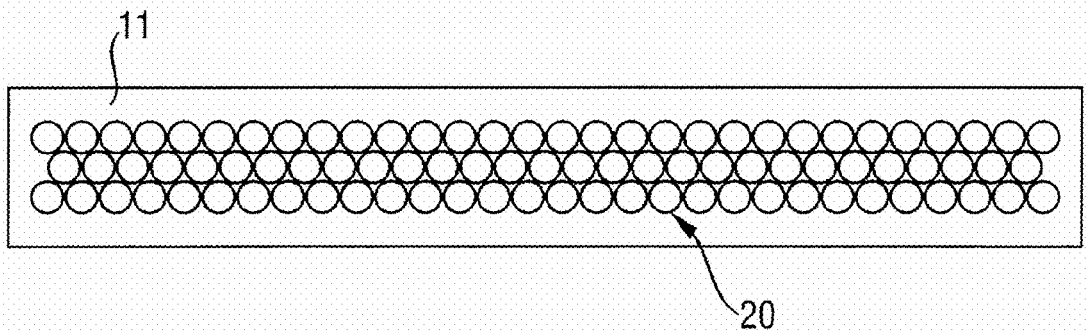
FIG. 8 is a front view of the LED light source device shown in FIG. 7.

In a specific example, as shown in FIGS. 7 & 8, this device can be equipped with multiple LED packages 20 that are comprised of the luminescent elements 21 and translucent light-guiding members 30 (FIGS. 7 & 8 show (2×30)+29 units). These multiple LED packages 20 can be arranged on top of a common substrate 11, and the multiple luminescent elements 21 that are equipped on this common substrate 11 can be arranged in a surface formation (belt formation) to be used as a light source.

In FIG. 7, element 17 is a multi-lens, element 18 is a condenser lens, and element 19 is a collimator lens. Note that the substrate 11 is not shown in this drawing.

In the case of an LED light source device equipped with multiple LED packages 20 in this fashion, each of these multiple LED packages is able to radiate light at a high level of uniformity, which makes it possible not only to uniformly irradiate light onto a surface with a considerable amount of surface area, but it is also possible to attain high illuminance over the given surface.

Further, by equipping the cylindrical base end part 31 with a light absorption layer 15, light is irradiated onto other adjoining LED packages 20 from this cylindrical base end part 31, and as a result of this light irradiation, it becomes possible to prevent overheating of the LED package 20. Therefore, it becomes possible to control overheating of the entire device as a result of heat that can occur with the generation of light from multiple luminescent elements 21.

Above, a detailed description of the LED light source device of the present invention has been given, but the present invention is not limited to the examples noted above, and may be modified in various ways.

Figure 9:
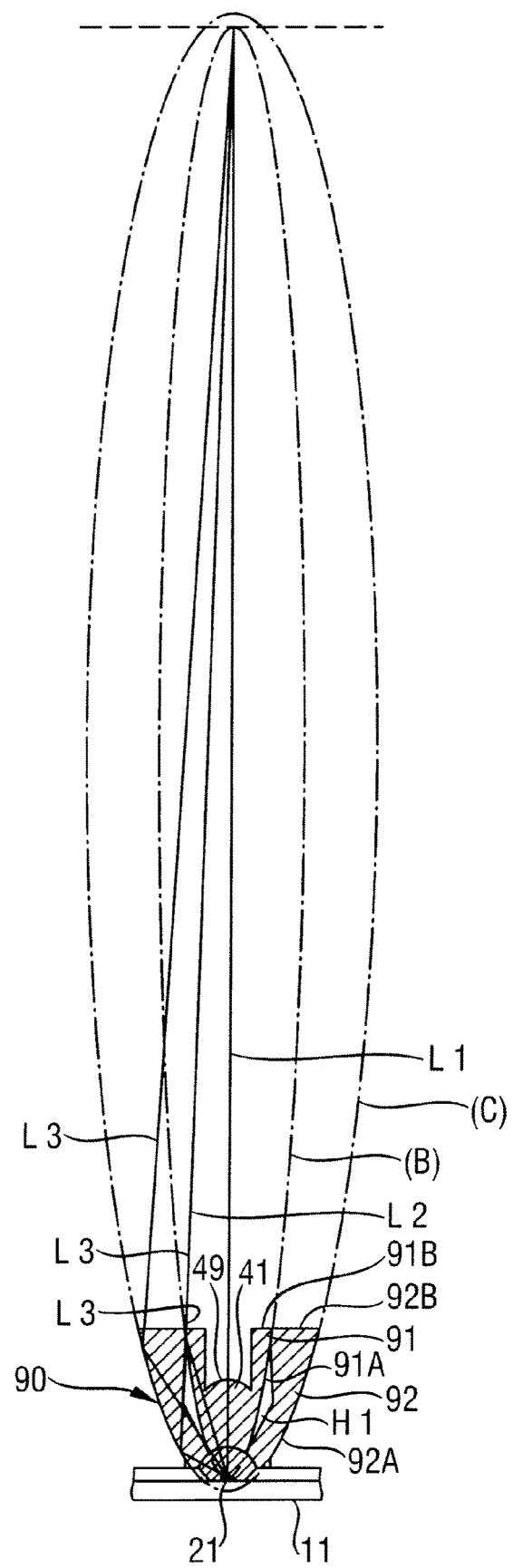
FIG. 9 is an explanatory cross-sectional view showing another example of the configuration of the LED light source device described in the present invention.
Figure 11:
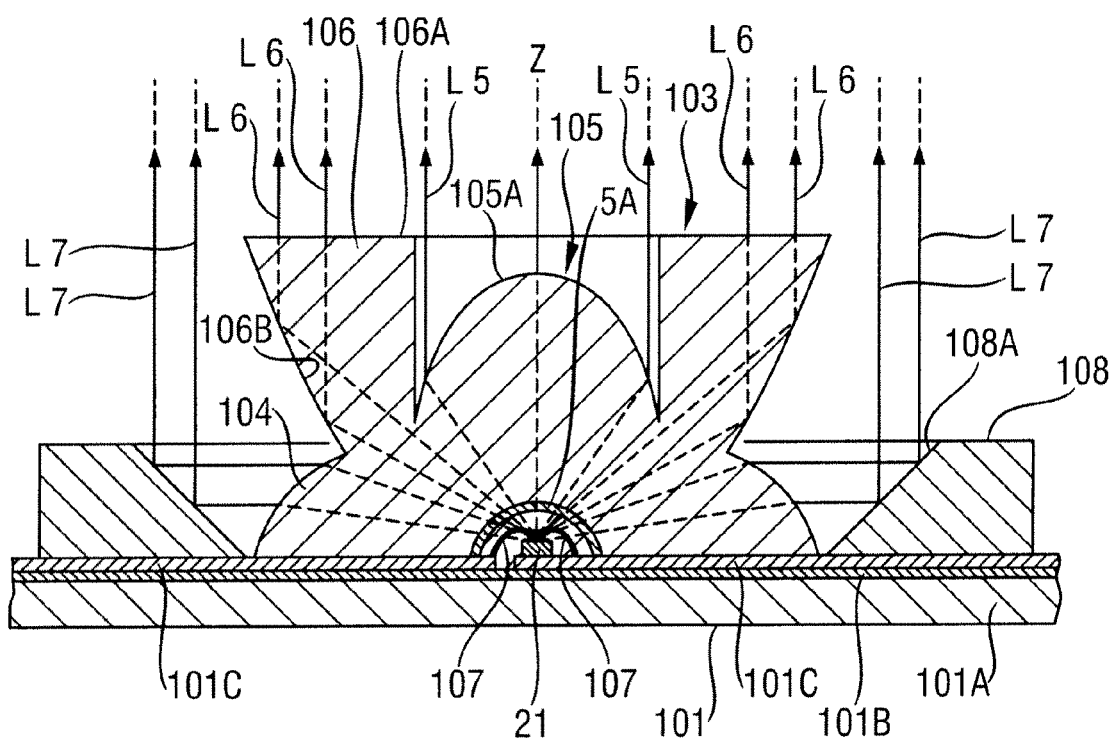
FIG. 11 is an explanatory cross-sectional view showing the configuration of a conventional LED light source device.

For example, the translucent light-guiding member has outer peripheral surfaces for both the first and second cylindrical light-guiding parts, both of which are rotated quadratic surfaces with the same focal point, and if both of these rotated quadratic surfaces are configured so that it is possible for light that is emitted from the luminescent elements to travel along the light axis of this translucent light-guiding member and be reflected in the light radiation direction, then it is acceptable for these rotated quadratic surfaces to be rotating elliptical surfaces, such as shown in FIG. 9, without restrictions on the rotating paraboloids that exist in the case of the translucent light-guiding member 30 related to FIG. 1.

Here, besides the fact that the LED light source device shown in FIG. 9 is equipped with a translucent light-guiding member 90 having rotated quadratic surfaces in the form of rotating elliptical surfaces, the rest of the configuration is the same as the LED light source device related to FIG. 1. Also, besides the fact that this translucent light-guiding member 90 has a first cylindrical light-guiding part 91 with an outer peripheral surface 91A and a second cylindrical light-guiding part 92 with an outer peripheral surface 92A, both of which are rotating elliptical surfaces with the same focal point, the rest of the configuration is the same as the translucent light-guiding member 30 related to FIG. 1.

In FIG. 9, L1 represents the light path for the light that first enters the central lens part 41 and is then radiated by the light radiation surface 49, L2 represents the light path for the light that first enters the first cylindrical light-guiding part 91 and is then reflected by the outer peripheral surface 91A, after which it is radiated from the light radiation surface 91B, and L3 represents the light path for the light that first enters the second cylindrical light-guiding part 92 and is then reflected by the outer peripheral surface 92A, after which it is radiated from the light radiation surface 92B. Further, the curved line (B) is a virtual line that extends the rotated elliptical surface related to the outer peripheral surface 91A of the first cylindrical light-guiding part 91, while the curved line (C) is a virtual line that extends the rotated elliptical surface related to the outer peripheral surface 92A of the second cylindrical light-guiding part 92.

Through the use of an LED light source device equipped with a translucent light-guiding member 90 of this configuration as well, it is possible not only to make use of light from luminescent elements 21 at a high level of efficiency as in the case of the LED light source device shown in FIG. 1, but it is also possible to achieve a considerable level of design freedom as well as provide uniform irradiation of light onto a given surface at high illuminance.

Figure 10:
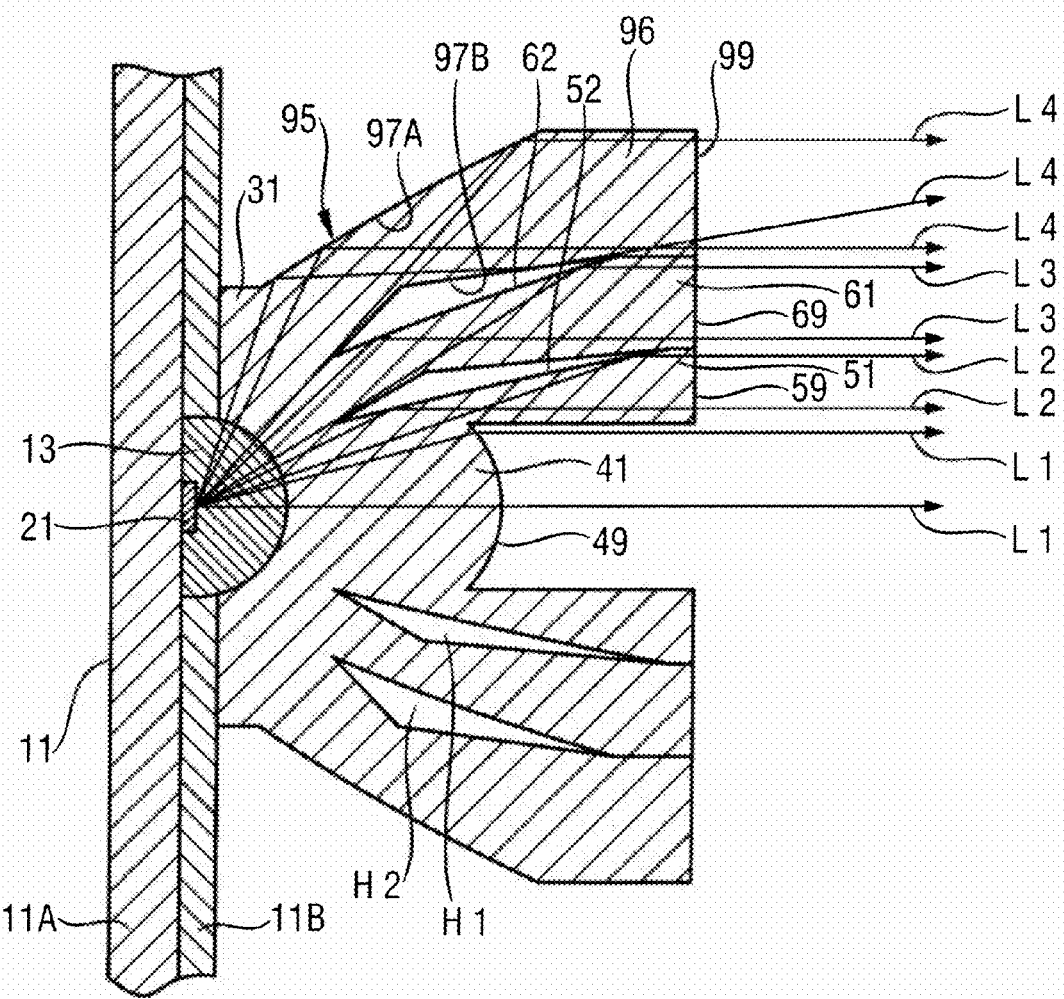
FIG. 10 is an explanatory cross-sectional view showing yet another example of the configuration of the LED light source device described in the present invention.

Further, it is acceptable if the translucent light-guiding member has a central lens part as well as a first and second cylindrical light-guiding part, and besides these components, it is acceptable for the configuration to include other components such as an outer periphery for the second cylindrical light-guiding part 61 and third cylindrical light-guiding part 96 as shown in FIG. 10.

Here, besides the fact that the LED light source device shown in FIG. 10 is equipped with a translucent light-guiding member 95 that has a third cylindrical light-guiding part 96, as well as a light absorption layer 15 on the outer periphery of the cylindrical base end part 31, the rest of the configuration is the same as the LED light source device related to FIG. 1. Also, besides the fact that this translucent light-guiding member 95 has a third cylindrical light-guiding part 96, the rest of the configuration is the same as the translucent light-guiding member 30 related to FIG. 1.

In this translucent light-guiding member 95, the third cylindrical light-guiding part 96 has basically the same structure as the second cylindrical light-guiding part 61.

Specifically, in the case of the translucent light-guiding member 95, along with the formation of an air layer H1 between the first cylindrical light-guiding part 51 and the second cylindrical light-guiding part 61, a space is formed between the outer peripheral surface 62 of the second cylindrical light-guiding part 61 and the inner peripheral surface 97B of the third cylindrical light-guiding part 96 such that it surrounds the second cylindrical light-guiding part 61, and through the use of this space, an air layer H2 is formed that surrounds the second cylindrical light-guiding part 61 and the third cylindrical light-guiding part 96.

Further, the inner peripheral surface 97B of the third cylindrical light-guiding part 96 which partitions the air layer H2 has a tapered shape that broadens toward the outside, and through the use of this inner peripheral surface 97B, a reflecting surface is formed for the purpose of providing total reflection for a portion of the light that is reflected by the outer peripheral surface 97A of the third cylindrical light-guiding part 96, namely the light that faces a direction other than that in which it is possible to directly reach the light radiation surface 99 within the third cylindrical light-guiding part 96. Further, the outer peripheral surface 97A of the third cylindrical light-guiding part 96 in which an air layer exists on the outer periphery is a rotated quadratic surface (in the example shown in the drawing, a rotated paraboloid, and this rotated quadratic surface composed of the outer peripheral surface 97A of the third cylindrical light-guiding part 96 has the same focal point as those belonging to the rotated quadratic surface composed of the outer peripheral surface 52 of the first cylindrical light-guiding part 51 as well as the peripheral surface 62 of the second cylindrical light-guiding part 61, and therefore, the configuration makes it possible for the light from the luminescent element 21 to travel along the light axis of the translucent light-guiding member 95 and be reflected in the light radiation direction.

In FIG. 10, L1 represents the light path for the light that first enters the central lens part 41 and is then radiated by the light radiation surface 49, L2 represents the light path for the light that first enters the first cylindrical light-guiding part 51 and is then reflected by the outer peripheral surface 52, after which it is radiated from the light radiation surface 59, L3 represents the light path for the light that first enters the second cylindrical light-guiding part 61 and is then reflected by the outer peripheral surface 62, after which it is radiated from the light radiation surface 69, and L4 represents the light path for the light that first enters the third cylindrical light-guiding part 96 and is then reflected by the outer peripheral surface 97A, and if needed, is also reflected by the inner peripheral surface 97B, after which it is radiated from the light radiation surface 99.

Through the use of an LED light source device equipped with a translucent light-guiding member 95 of this configuration as well, it is possible not only to make use of light from luminescent elements 21 at a high level of efficiency as in the case of the LED light source device shown in FIG. 1, but it is also possible to achieve a considerable level of design freedom as well as provide uniform irradiation of light onto a given surface at high illuminance.

Further, as discussed above, the configuration of the inner peripheral surface of the first cylindrical light-guiding part in the translucent light-guiding member is not particularly limited as long as it does not cause blockage of the light path for the light that is radiated from the light radiation surface of the first cylindrical light-guiding part as well as the light radiation surface of the central convex lens part. For example, a stepped configuration may be used.

Further, as shown in FIG. 1, the luminescent light elements 21 of the LED light source device are molded products using a molding member 13, and this device is not limited to a configuration in which there is a light junction between this molding member 13 and the translucent light-guiding member 30. For example, in cases where a luminescent element with a high heating value is used, a configuration can be used in which a translucent light-guiding member is installed with a specified air space (air layer) between it and the luminescent elements, taking into consideration the heat resistance capabilities of the translucent light-guiding member.

What is claimed is:

1. An LED light source device, comprising:
    luminescent elements and
    a translucent light-guiding member,
    wherein the translucent light-guiding member has a central convex lens with a first cylindrical light-guiding part formed on an outer peripheral surface of the central convex lens, and a second cylindrical light-guiding part formed on an outer peripheral surface of the first cylindrical light-guiding part,
    wherein an air layer is formed between the outer peripheral surface of the first cylindrical light-guiding part and an inner peripheral surface of the second cylindrical light-guiding part,
    wherein the outer peripheral surface of the first cylindrical light-guiding part and the outer peripheral surface of the second cylindrical light-guiding part are rotated quadratic surfaces, each with the same focal point, and
    wherein each of the rotated quadratic surfaces is positioned to receive light emitted from the luminescent element and to cause said light to travel along an optical axis of the translucent light-guiding member and be reflected in a light radiation direction.

2. The LED light source device according to claim 1, wherein the inner peripheral surface of the second cylindrical light-guiding part has a tapered shape that widens toward the outside such that a portion of the light that is reflected at the outer peripheral surface of the second cylindrical light-guiding part is obstructed.

3. The LED light source device according to claim 2, wherein the translucent light-guiding member is made from a material having a refractive index of at least 1.4.

4. The LED light source device according to claim 1, wherein the translucent light-guiding member is made from a material having a refractive index of at least 1.4.

5. The LED light source device according to claim 4, wherein multiple luminescent elements are provided on a common substrate and a said translucent light-guiding member is provided for each of the multiple luminescent elements.

6. The LED light source device according to claim 1, wherein multiple luminescent elements are provided on a common substrate and a said translucent light-guiding member is provided for each of the multiple luminescent elements.

7. The LED light source device according to claim 2, wherein multiple luminescent elements are provided on a common substrate and a said translucent light-guiding member is provided for each of the multiple luminescent elements.

8. The LED light source device according to claim 3, wherein multiple luminescent elements are provided on a common substrate and a said translucent light-guiding member is provided for each of the multiple luminescent elements.

* * * * *